(12) United States Patent
Aboush

(10) Patent No.: US 8,970,435 B2
(45) Date of Patent: Mar. 3, 2015

(54) PIE SHAPE PHASED ARRAY ANTENNA DESIGN

(71) Applicant: Cambridge Silicon Radio Limited, Cambridge (GB)

(72) Inventor: Zaid Aboush, Phoenix, AZ (US)

(73) Assignee: Cambridge Silicon Radio Limited, Cambridge (GB)

( * ) Notice: Subject to any disclaimer, the term of this patent is extended or adjusted under 35 U.S.C. 154(b) by 202 days.

(21) Appl. No.: 13/646,620

(22) Filed: Oct. 5, 2012

(65) Prior Publication Data

US 2014/0097990 A1 Apr. 10, 2014

(51) Int. Cl.
*H01Q 1/38* (2006.01)
*H01Q 9/04* (2006.01)

(52) U.S. Cl.
CPC ........... *H01Q 9/0435* (2013.01); *H01Q 9/0407* (2013.01)
USPC .................................................. 343/700 MS

(58) Field of Classification Search
USPC .................................................. 343/700 MS
See application file for complete search history.

(56) References Cited

U.S. PATENT DOCUMENTS

| | | | |
|---|---|---|---|
| 4,746,867 A * | 5/1988 | Gunton | 324/329 |
| 4,967,199 A | 10/1990 | Gunton et al. | |
| 5,757,324 A * | 5/1998 | Helms et al. | 343/700 MS |
| 6,501,427 B1 | 12/2002 | Lilly et al. | |
| 7,522,122 B2 * | 4/2009 | Yoon et al. | 343/895 |
| 8,228,258 B2 * | 7/2012 | Montgomery | 343/860 |
| 2010/0073239 A1 | 3/2010 | Tatarnikov et al. | |

FOREIGN PATENT DOCUMENTS

| | | |
|---|---|---|
| GB | 2089560 | 6/1982 |
| GB | 2165702 | 4/1986 |
| GB | 2303740 | 2/1997 |
| GB | 2316233 | 2/1998 |

OTHER PUBLICATIONS

Search Report issued Mar. 17, 2014 in corresponding application GB1307305.1.

* cited by examiner

*Primary Examiner* — Hoang V Nguyen
(74) *Attorney, Agent, or Firm* — Pillsbury Winthrop Shaw Pittman LLP

(57) ABSTRACT

A radially segmented antenna design is described. In an embodiment, the radially segmented antenna is formed from multiple patches which are arranged in a ring around the central point of the radially segmented antenna. Each patch is shaped to form a segment of the ring and is separated from the two adjacent patches. In operation, alternate patches in the ring may be used for transmitting and the remaining patches may be terminated in an open circuit or may be used for receiving. Alternatively, all the patches in the ring may be used for transmitting or receiving. In some examples, there may be more than one concentric ring of patches within the radially segmented antenna and the additional rings may be located on the same face of the antenna as the first ring of patches, or on the opposite face of the antenna.

13 Claims, 9 Drawing Sheets

PIE SHAPE PHASED ARRAY ANTENNA DESIGN

BACKGROUND

FIG. 1 shows a conventional phased array patch antenna both in plan view (diagram 100, assuming that the antenna is arranged in a horizontal plane) and in cross-section (diagram 102). The antenna comprises an array of square patches 104 which have sides which are each approximately half a wavelength ($\lambda/2$) long. For a single patch, the patch 104 and the ground 106 underneath together form a resonant piece of microstrip line with a length of approximately one-half wavelength of the resonance frequency. Such antennas are usually linearly polarized; however a circularly polarized patch antenna can be fabricated by either feeding using two feeds with 90° phase shift between them or by introducing asymmetry in the patch (e.g. by making a slot in the patch).

The embodiments described below are not limited to implementations which solve any or all of the disadvantages of known phased patch array antennas.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An antenna design is described. In an embodiment, the antenna is formed from multiple patches which are arranged in a ring around the central point of the circular or hexagonal antenna. Each patch is shaped to form a segment of the ring and is separated from the two adjacent patches. In operation, alternate patches in the ring may be used for transmitting and the remaining patches may be terminated in an open circuit or may be used for receiving. Alternatively, all the patches in the ring may be used for transmitting or receiving. In some examples, there may be more than one concentric ring of patches within the circular antenna and the additional rings may be located on the same face of the antenna as the first ring of patches, or on the opposite face of the antenna.

A first aspect provides a radially segmented antenna comprising a first plurality of patches arranged in a ring around a central point and wherein each patch forms a segment of the ring and is spaced from two adjacent patches in the ring.

A second aspect provides a method of operating a circular antenna, the circular antenna comprising a first plurality of patches arranged in a ring around a central point and wherein each patch forms a segment of the ring and is spaced from two adjacent patches in the ring, and the method comprising: applying a drive signal to each of a subset of the first plurality of patches, the subset comprising alternate patches in the ring.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
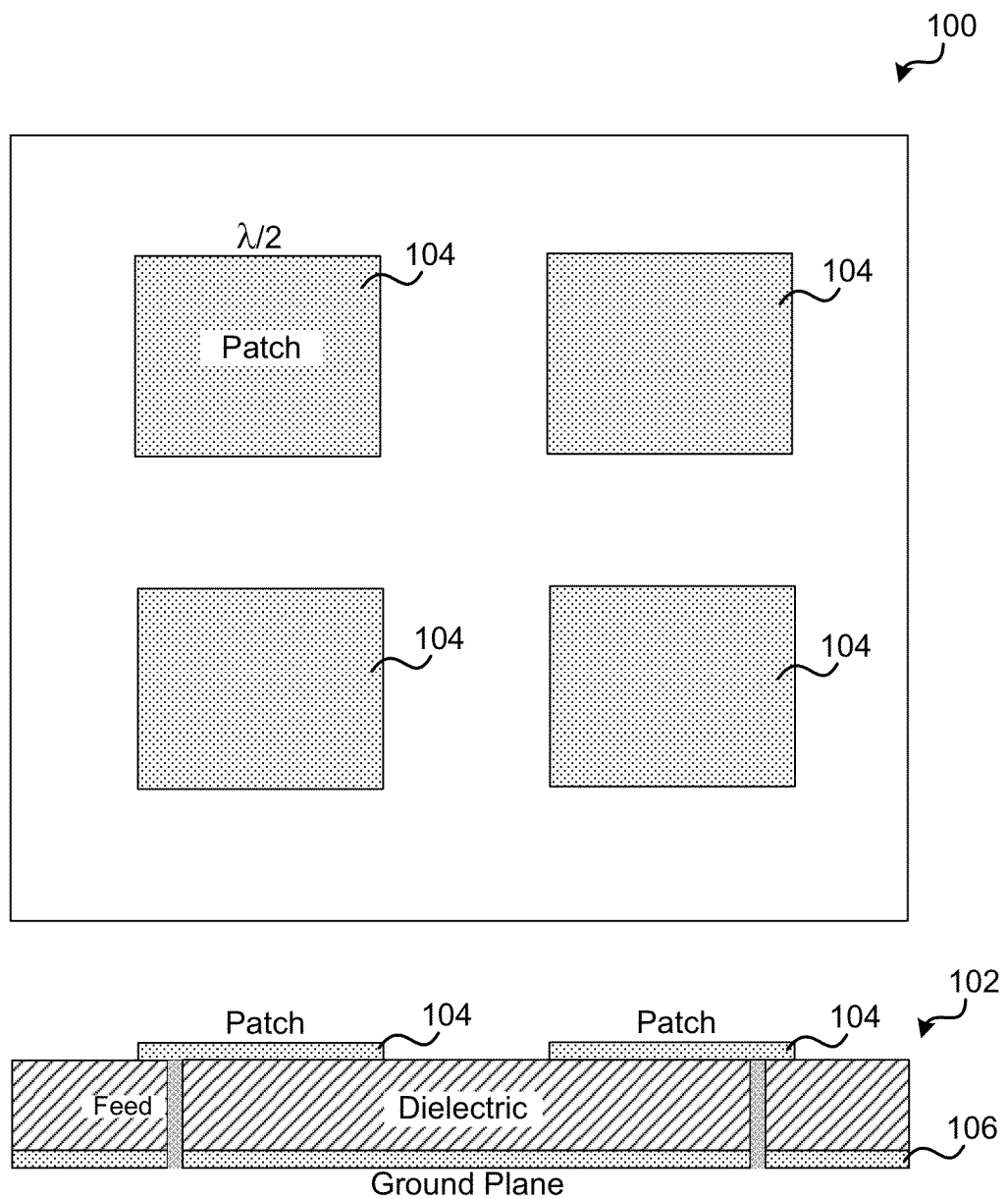
FIG. 1 is a schematic diagram of a conventional phased array patch antenna.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 2:
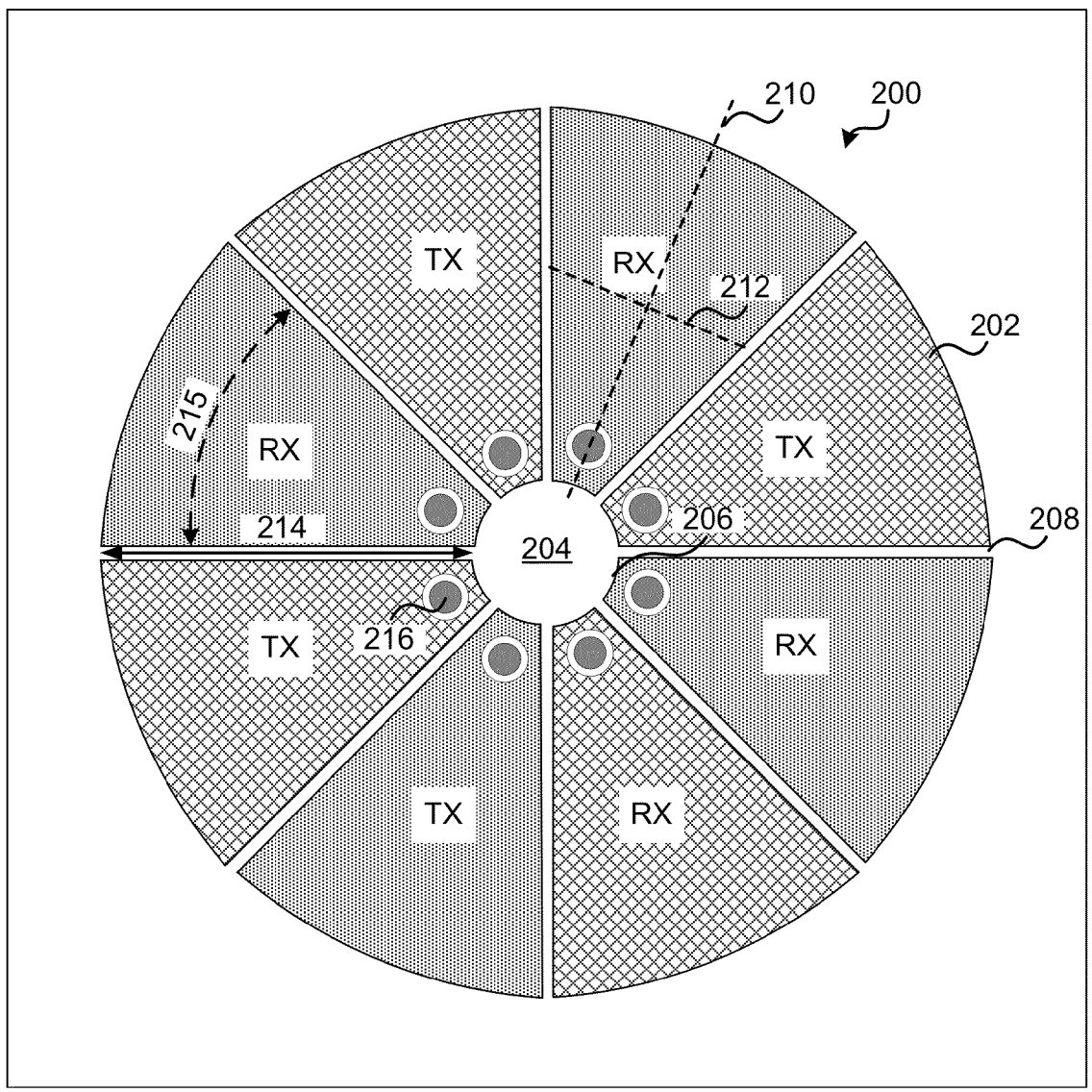
FIG. 2 shows a schematic diagram of an example improved patch antenna which has a circular shape.

FIG. 2 shows a schematic diagram of an example improved phased array patch antenna 200 which has a circular shape. The antenna is a radially segmented antenna. The patches 202, which in the example shown are all the same size and shape, each resemble the shape of a slice of pie and the antenna may therefore be referred to as a 'pie antenna' The antenna may be used as a transmit antenna only in which multiple beams can operate without interacting with each other. As shown in FIG. 2, the patches 202 are arranged in a ring around a central circular region 204 which is clear of any patches and which may be used to provide the feed lines 206. Each patch 202 comprises a segment of the ring and is spaced from the two adjacent patches. The spaces 208 between patches lie along radii of the antenna 200 and hence the spaces 208 may be described as radiating out from the central circular region 204. The width of a patch 202 reduces (i.e. the patch tapers) towards the central circular region 204.

It can be seen from FIG. 2 that each patch 202 is symmetrical about a radius which bisects the patch (indicated by dotted line 210) but is asymmetric about any line through the patch which is perpendicular to this radius (e.g. about dotted line 212). The radial length of a patch (indicated by arrow 214) may be approximately $\lambda/2$ (where $\lambda$ is the resonance wavelength of the antenna) and the actual physical size is dependent upon the dielectric constant of the materials used in fabricating the antenna. In one example, for a 60 GHz resonance frequency and a particular dielectric, this dimension is of the order of 2-3 min or less. The angular size of each patch (as indicated by dotted are 215) is bounded by the number of patches 202 in the antenna array (i.e. this sets an upper limit of the angular size) and in this example, there are eight patches each of which is at an angular pitch of 45°. It will be appreciated that although FIG. 1 shows eight patches, this is by way of example only and the circular patch antenna may comprise any number of patches. With a larger number of patches, the maximum possible angular size of a patch is reduced and with a smaller number of patches, the maximum possible angular size of a patch is increased. However, by changing the width of the spaces between adjacent patches, there need not be a linear relationship between number of patches and angular size of a patch. Although FIG. 2 shows patches which are all of the same size and shape, further examples may include patches of different sizes and/or shapes e.g. the patches 202 may have logarithmic scaling.

Figure 4:
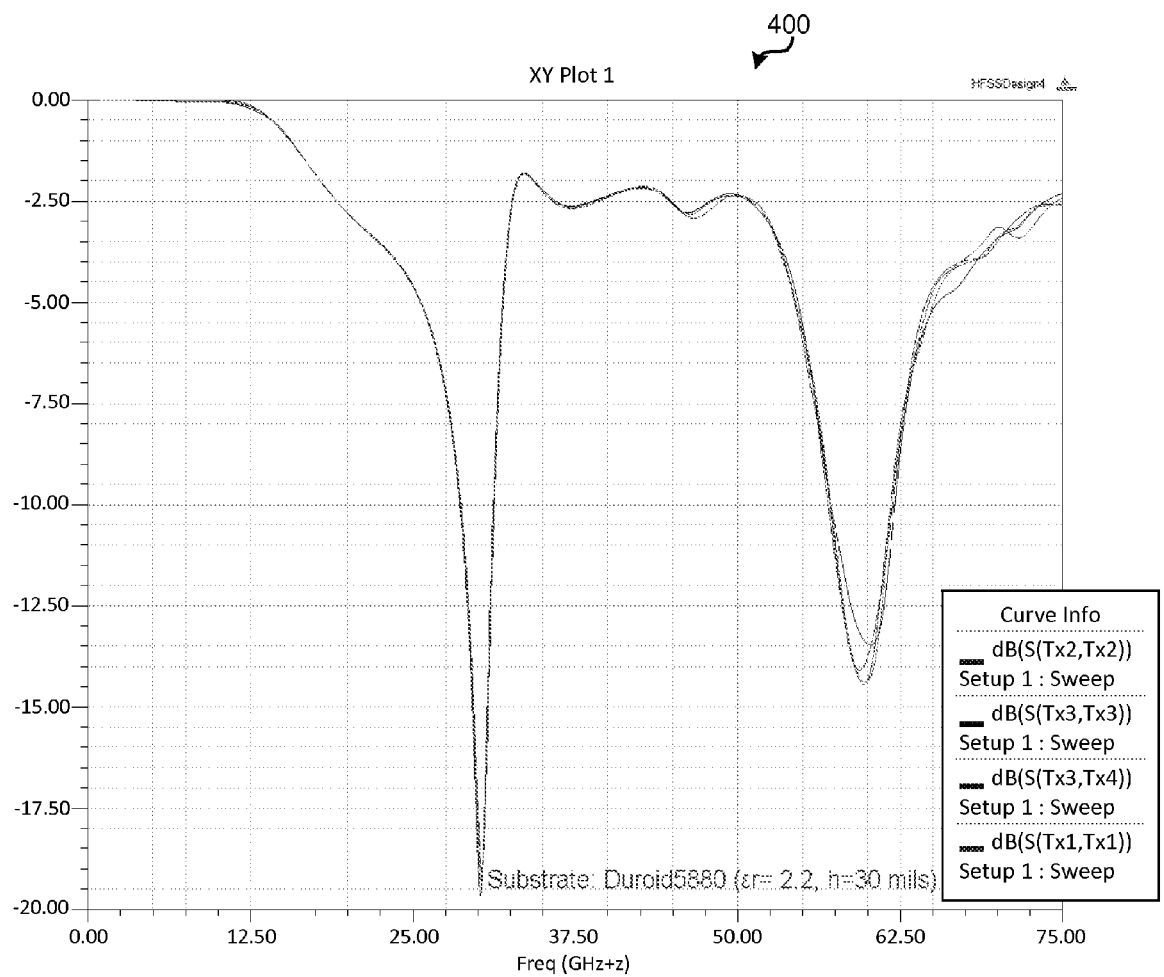
FIG. 4 shows an example frequency response for an example circular antenna such as is shown in FIG. 2.

The dimensions of a patch 202, e.g. the area of a patch, may be selected to provide a resonance frequency, which is suited to the target application of the pie antenna 200. FIG. 4 shows an example frequency response 400 for a particular example pie antenna comprising eight patches (as shown in FIG. 2) and fabricated using Rogers RT/Duroid® 5880 (a high frequency laminate which may be used in PCBs) which has a dielectric constant of 2.2 and a thickness of approximately 0.76 mm (0.030"). Two resonances can be observed, one at 30 GHz and the other at 60 GHz. The tapering shape of each patch has the effect of increasing the bandwidth around a central resonant frequency (e.g. around 60 GHz in the example shown in FIG. 4).

The feed point 216 for each patch 202 may be located towards the centre of the antenna, i.e. towards the central circular region 204, and in the example shown in FIG. 2 is arranged centrally (in an angular direction) to the patch 202, i.e. the feed point 216 lies on the radius which bisects the patch (e.g. as indicated by dotted line 210). In other examples, however, the feed point 216 may be offset slightly (in an angular direction) such that it does not lie on the radius which bisects the patch but is still located close to the central circular region 204. In the example shown, the feed points 216 lie on a circle around the central circular region 204 such that each feed point 216 is the same distance from the centre of the circular antenna 200. However, the feed point may be located anywhere within the patch. As shown in FIG. 2, the feed lines 206 may run radially from the feed points 216 into the central circular region 204.

Figure 3:
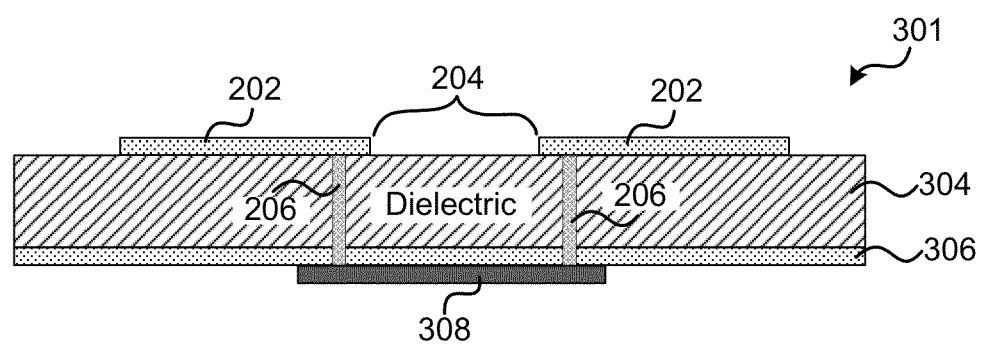
FIG. 3 shows a schematic diagram of three example cross-sections through a circular antenna such as is shown in FIG. 2.
Figure 3:
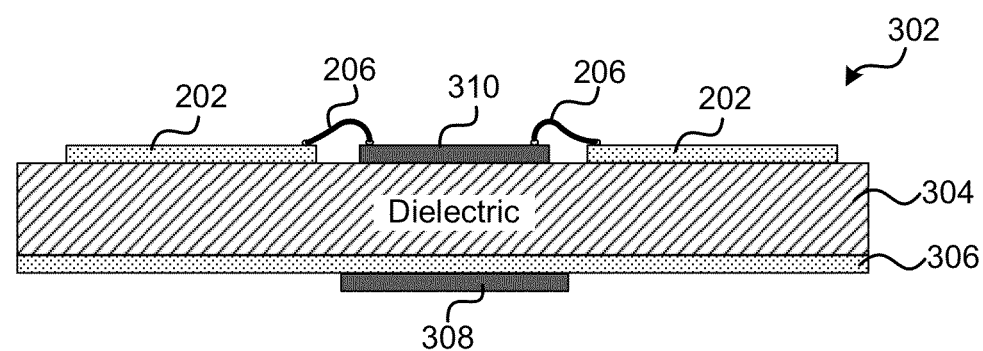
Figure 3:
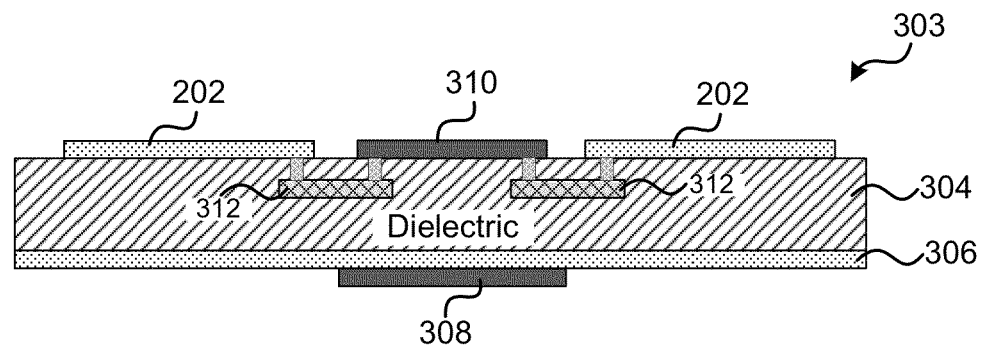

FIG. 3 shows a schematic diagram of three example cross-sections through the antenna 200. In the first example 301, the feed lines 206 do not run radially but instead are perpendicular to the plane in which the patches 202 are formed (e.g. vertical in the orientation shown in FIG. 3). In this example, the feed lines 206 are formed by vias in the dielectric 304 and ground plane 306 and connect the patches 202 to a chip 308 mounted on the rear side of the antenna (i.e. on the opposite side to the patches). This chip 308 (which may be a silicon chip) may be a transmit chip or a receive chip or the same chip may provide both the transmit and receive functionality (for the RF circuitry at least).

In the second and third examples 302, 303, the feed lines 206 run radially and connect patches 202 to a chip 310 which is mounted on the front side of the antenna (i.e. on the same side as the patches 202). Although the second example 302 shows the feed lines 206 as wires connecting the patches 202 to the chip 310, it will be appreciated that in other examples, a multi-layer construction (e.g. a multi-layer PCB) may be used and the radial feed lines may be provided in a metal layer 312 which is spaced from the metal layer which is used to form the patches 202, as shown in the third example 303.

In some implementations, the transmit and receive functionality may be implemented in separate chips and in such implementations one chip 310 (e.g. transmit or receive) may be mounted on the front side of the antenna and the other chip 308 may be mounted on the rear side of the antenna. Connections (e.g. feed lines) between the front-side chip 310 and a subset of the patches 202 may then be as shown in either the second or third examples 302, 303 and connections between the rear-side chip 308 and a second subset of the patches 202 (e.g. the remaining patches which are not connected to the front-side chip) may be as shown in the first example 301. In another example, the transmit and receive functionality may be implemented on multiple layers. In an embodiment the patch array may be realised at the back of the silicon (e.g. back of the WLCSP package) in which a through silicon via (TSV) can be used to feed each patch. In another embodiment, only half of the patch array antenna may be fabricated on the back side of the chip. In various examples, the feeds can be any of TSV, side plating, or wire bond. This may be particularly useful for MIMO WiFi applications where more than one radio may operate simultaneously. It will be appreciated that although the first and second examples 301, 302 in FIG. 3 only show two layers of metallization separated by a dielectric layer 304, these may be fabricated using a single layer printed circuit board (PCB) or a multi-layer PCB. In some implementations a plurality of chips may be used, for example, two or more front-side chips and/or two or more back-side chips. In some implementations network or impedance matching may also be used to reduce reflection and increase transmission efficiency.

By locating the feed points 216 close to the central circular region 204 and mounting the transmit/receive (RF) chip in the central circular region (or in a corresponding position on the rear side of the antenna), the distance between the RF-chip output and the antenna feed points 216 is minimized. This minimizes the delay and loss. Furthermore, the circular geometry means that every feed line is the same length (to within manufacturing tolerances) and this minimizes (and potentially eliminates) the delay difference (i.e. the phase mismatch) between different channels (where these channels correspond to different patches). This increases the efficiency of the antenna and improves directionality.

The improved patch antenna 200 shown in FIGS. 2 and 3 may be fabricated using standard PCB technology.

A single patch 202 in the improved patch antenna 200 described above radiates circularly polarized waves. This is as a result of the asymmetric shape of a patch, as shown in FIG. 2 and described above, in combination with the position of the feed point 216.

In use, alternate patches 202 may be used for transmitting and receiving (as shown in FIG. 2) or alternatively, all the patches 202 may be used for transmitting or for receiving. In a further example, alternate patches may be used for transmitting (or for receiving) and the remaining patches may form dummy patches and not be actively used. Simulations have shown that similar gain can be obtained with an eight patch antenna (as shown in FIG. 2) either when four patches are transmitting simultaneously with a 90° phase shift between adjacent transmitting patches (and the remaining four patches are terminated into an open circuit) or when all eight patches are transmitting simultaneously with a 45° phase shift between adjacent patches. If, however, the non-transmitting patches are terminated into a 50Ω port (instead of an open circuit), the total gain is reduced significantly As with conventional array patch antennas, it is possible to perform beam steering (i.e. reinforcing the effective far field radiation pattern of the antenna in a desired direction and suppressing it in non-desired directions) by adjusting the relative phases of drive signals for the different patches. An antenna with a higher number of patches may give an greater steering resolution, for example, an antenna with 8 patches may give a better steering resolution than an antenna with four patches.

The improved patch antenna 200 shown in FIG. 2 and described above is compact (e.g. it may be approximately half the size of a conventional patch array antenna) and, unlike conventional antennas, is not limited by a patch pitch (and hence spacing between patches) which is wavelength dependent. Additionally, both transmit and receive patches can be provided within the same area (whereas, the four patch arrangement shown in FIG. 1 would need to be duplicated in order to provide both transmit and receive, thereby doubling the area of the antenna array). The small size of the improved patch antenna 200 makes it well suited to mobile applications where there is limited area for antennas. The improved patch antenna 200 also provides large gain (the example device described above with reference to FIG. 4 had an unmatched maximum radiation gain of 11.4 dBi for four transmitting patches and this gain is improved by implementing proper matching at each antenna feed). The antenna may also be fabricated using standard processes and so does not result in additional cost or process complexity as well as consistency and tolerance control.

Although the example improved antenna 200 in FIG. 2 has a circular central area 204 which is relatively small in size compared to the overall size of the antenna, in other examples, the radius of the circular central area 204 may be larger (e.g. the radius of the central area may be half of the total radius of the antenna), although this may result in reduced gain. Use of a larger circular central area 204 may, for example, allow mounting of a larger chip (or die) at the centre of the antenna. In yet further examples, there may be no circular central area and instead the patches may be arranged around the central point of the antenna and in such an example, each patch may have two straight sides and one arcuate side rather than two straight sides and two arcuate sides.

Figure 5:
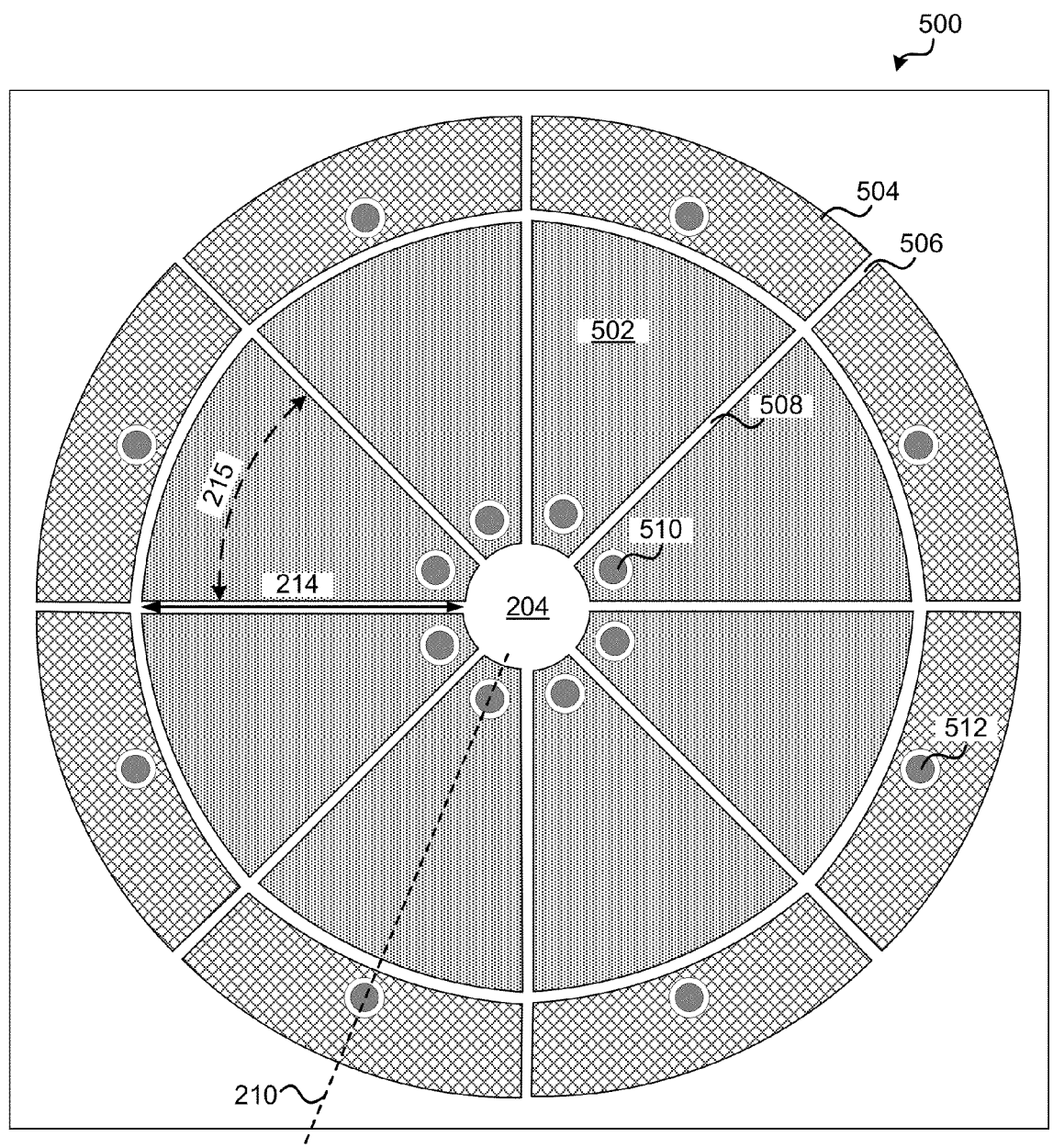
FIG. 5 shows a schematic diagram of another example improved patch antenna which has a circular shape.
Figure 6:
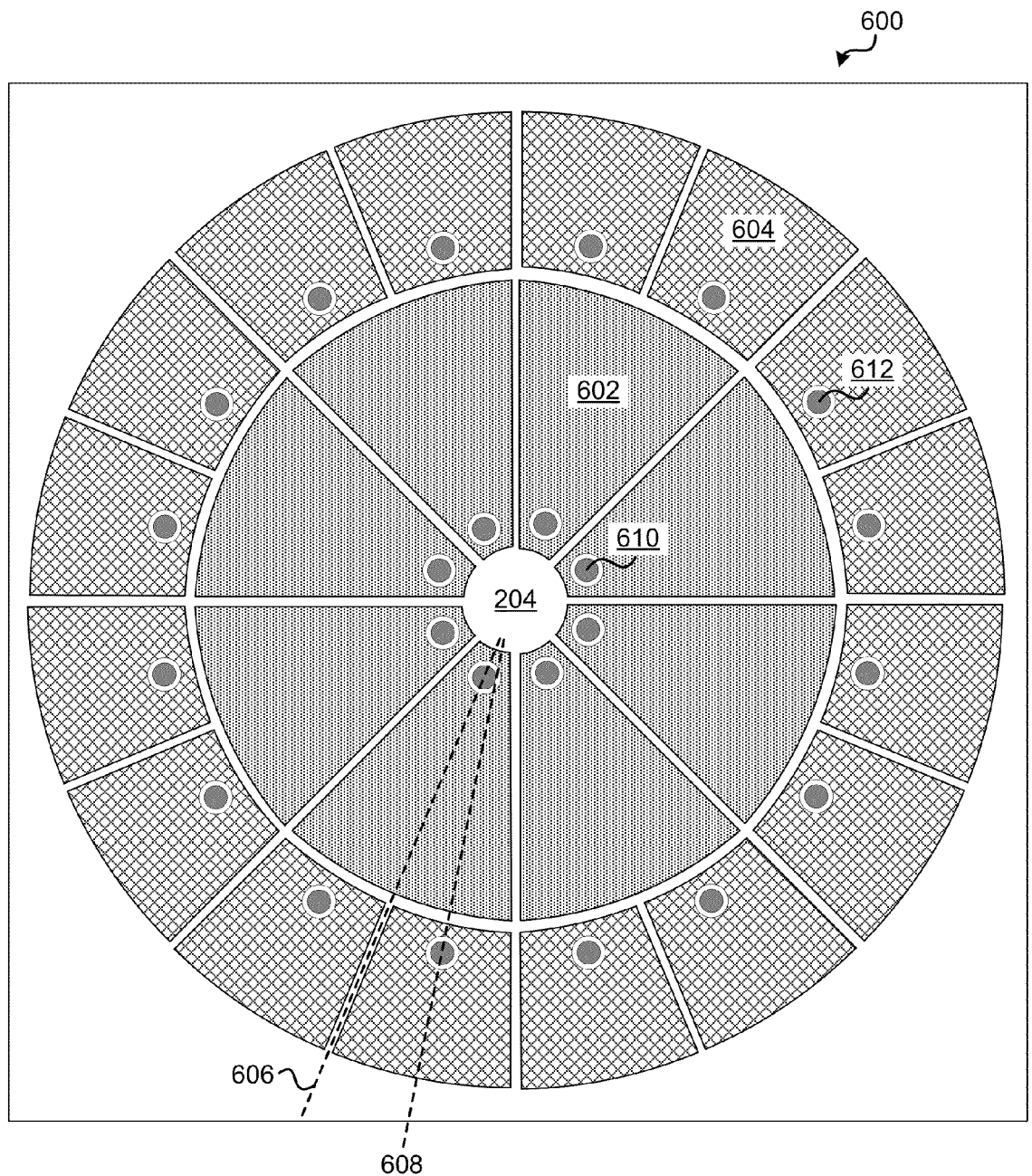
FIG. 6 shows a schematic diagram of a further example improved patch antenna which has a circular shape.

FIGS. 5 and 6 show schematic diagrams of further examples of improved patch antennas which have a circular shape. Each of these example improved patch antennas 500, 600 comprise two concentric rings of patches and in other examples there may be more than two concentric rings of patches.

The example antenna 500 shown in FIG. 5 comprises an inner ring of patches 502 and an outer ring of patches 504 separated by a small space. As with the example shown in FIG. 2 and described above, these rings surround a central circular region 204 which is free of patches. All of the patches 502, 504 form segments of their respective ring of patches and adjacent patches within the same ring are separated by spaces which run radially outwards from the central circular region 204. As shown in FIG. 5, there may be the same number of patches in the two concentric rings (e.g. in the example shown the inner ring comprises eight patches 502 and the outer ring also comprises eight patches 504) and in such an arrangement, all the spaces between patches are aligned (e.g. space 506 is a continuation of space 508). In some implementations patches 502, 504 may be offset from each other e.g. the rings of patches may be staggered.

It can be seen from FIG. 5 that each patch 502, 504 is symmetrical about a radius which bisects the patch (indicated by dotted line 210) but is asymmetric about any line through the patch which is perpendicular to this radius. As described above with reference to FIG. 2, the dimensions of a patch 502, 504, e.g. the area of a patch, may be selected to provide a resonance frequency, which is suited to the target application of the pie antenna 500. The radial length (indicated by arrow 214) of a patch 502 in the inner ring of patches may be approximately $\lambda/2$ (where $\lambda$ is the resonance wavelength of the antenna) and the actual physical size is dependent upon the dielectric constant of the materials used in fabricating the antenna. The area of each of the patches 504 in the outer ring of patches is, in this example, the same as the area of each of the patches 502 in the inner ring, such that they may have the same resonance frequency (and hence resonance wavelength).

The feed points 510, 512 may, as described above, be positioned towards the end of the patch which is closest to the central circular region 204 and may be positioned centrally within the patch (from an angular perspective) such that the feed point 510, 512 lies on a radius which bisects the patch (e.g. as indicated by dotted line 210). In other examples, the feed points 510, 512 in one or both rings of patches may be offset from this central position.

As described above with reference to FIG. 2, the patches 502, 504 radiate circularly polarized waves as a result of the asymmetric shape of a patch.

There are many ways in which the antenna 500 may be driven and in one example, one patch 502 in the inner ring and the adjacent patch 504 in the outer ring may be fed simultaneously in order to obtain increased gain from the antenna 500 compared to a corresponding antenna (with the same resonance frequency) comprising a single ring of patches (e.g. antenna 200 as shown in FIG. 2). In another example, the pair of patches (i.e. one patch 502 in the inner ring and the adjacent patch 504 in the outer ring) may be fed differentially and this may enable a reduced component count in the circuitry which provides the drive signal to the patches. As described above with reference to FIG. 2, some of the patches within a ring of patches may be used to transmit and others may be used for receiving (e.g. alternate patches may be used for transmit and receive) or all the patches may be used for transmitting/receiving. Furthermore, as described above, by adjusting the relative phase of the drive signals to patches within a ring of patches, beam steering may also be implemented using this antenna 500.

The example antenna 600 shown in FIG. 6, like the antenna 500, also comprises an inner ring of patches 602 and an outer ring of patches 604 separated by a small space; however in this example there are a different number of patches in each ring. In this particular example, there are twice as many patches 604 in the outer ring (16 patches) as there are patches 602 in the inner ring (8 patches).

As in the earlier examples (shown in FIGS. 2 and 5), all of the patches 602, 604 form segments of their respective ring of patches and each patch is separated from the adjacent patches within the same ring by spaces which run radially outwards from a central circular region 204 which is free from any patches. As a result of the different numbers of patches in the two rings, the spaces between patches ring do not necessarily align with the spaces between patches in the inner ring (in this example, half the spaces are aligned).

As described above, each patch 602, 604 is symmetrical about a radius which bisects the patch (indicated by dotted lines 606, 608) but is asymmetric about any line through the patch which is perpendicular to this radius. Again the area of a patch may be selected to provide a desired resonance frequency and in the example shown in FIG. 6, each patch 602, 604 has the same area and hence may have the same resonance frequency. As in earlier examples, the feed points 610, 612 may be positioned towards the end of the patch which is closest to the central circular region 204 and may be positioned centrally within the patch (from an angular perspective) such that the feed point 610, 612 lies on a radius which bisects the patch (e.g. as indicated by dotted lines 606, 608). In other examples, the feed points 610, 612 in one or both rings of patches may be offset from this central position.

As with antenna 500, the asymmetry of the patches 602, 604 means that they radiate circularly polarized waves and there are many ways in which the antenna 600 shown in FIG. 6 may be driven. In one example, one patch 602 in the inner ring and the two adjacent patches 604 in the outer ring may be fed simultaneously in order to obtain increased gain from the antenna 600 compared to a corresponding antenna (with the same resonance frequency) comprising a single ring of patches (e.g. antenna 200 as shown in FIG. 2) or compared to antenna 500 shown in FIG. 5. As described above with reference to FIGS. 2 and 5, some of the patches within a ring of patches may be used to transmit and others may be used for receiving (e.g. alternate patches may be used for transmit and receive) or all the patches may be used for transmitting/receiving. Furthermore, as described above, by adjusting the relative phase of the drive signals to patches within a ring of patches, beam steering may also be implemented using this antenna 600.

In the two examples shown in FIGS. 5 and 6 all the patches have the same area and hence may have the same resonance frequency; however in further examples the different rings may be formed from patches with different areas and/or different dimensions such that a first concentric ring of patches provides an antenna array with a first resonance frequency and a second concentric ring of patches provides an antenna array with a second resonance frequency. In an example each of the patches in the first plurality of patches is of a first area and each of the patches in the second plurality of patches is of a second area, and the first and second areas are different sizes. In another example each of the patches in the first plurality of patches has a first set of dimensions i.e. height/length and/or width, and a second set of patches in the second plurality of patches has a second set of dimensions, and the dimensions of the first and second set of patches are different. For example, patches with the same area but different dimensions may resonate at different frequencies, in another example other factors in addition to the area such as the aspect ratio, feed point, and the shape may determine the resonance frequency.

Such a circular antenna would therefore provide a multi-wavelength or multi-band antenna or may be used to provide a broader bandwidth (e.g. by having the two resonance frequencies close together). In another example, one of the rings of patches may be used to provide tuning elements to adjust the performance of the other ring of patches (e.g. in terms of frequency response). The patches act as parasitic elements which reflect and divert the energy in a certain direction at certain frequency. In the examples described above with reference to FIGS. 5 and 6, the two (or more) concentric rings of patches are provided within the same metal layer on the same surface of the substrate (e.g. on the same side of the PCB). However, in further examples, concentric rings of patches may be provided on both sides of the substrate and/or in different metal layers on/within the substrate. In an example shown three different views (front side 702, rear side 704 and cross-section 706) in FIG. 7, there may be concentric rings of patches 708, 710 on each side of the substrate 712. The two rings of patches may have the same design (e.g. size of patches, number of patches) as shown in FIG. 7 or may be of different designs.

Figure 7:
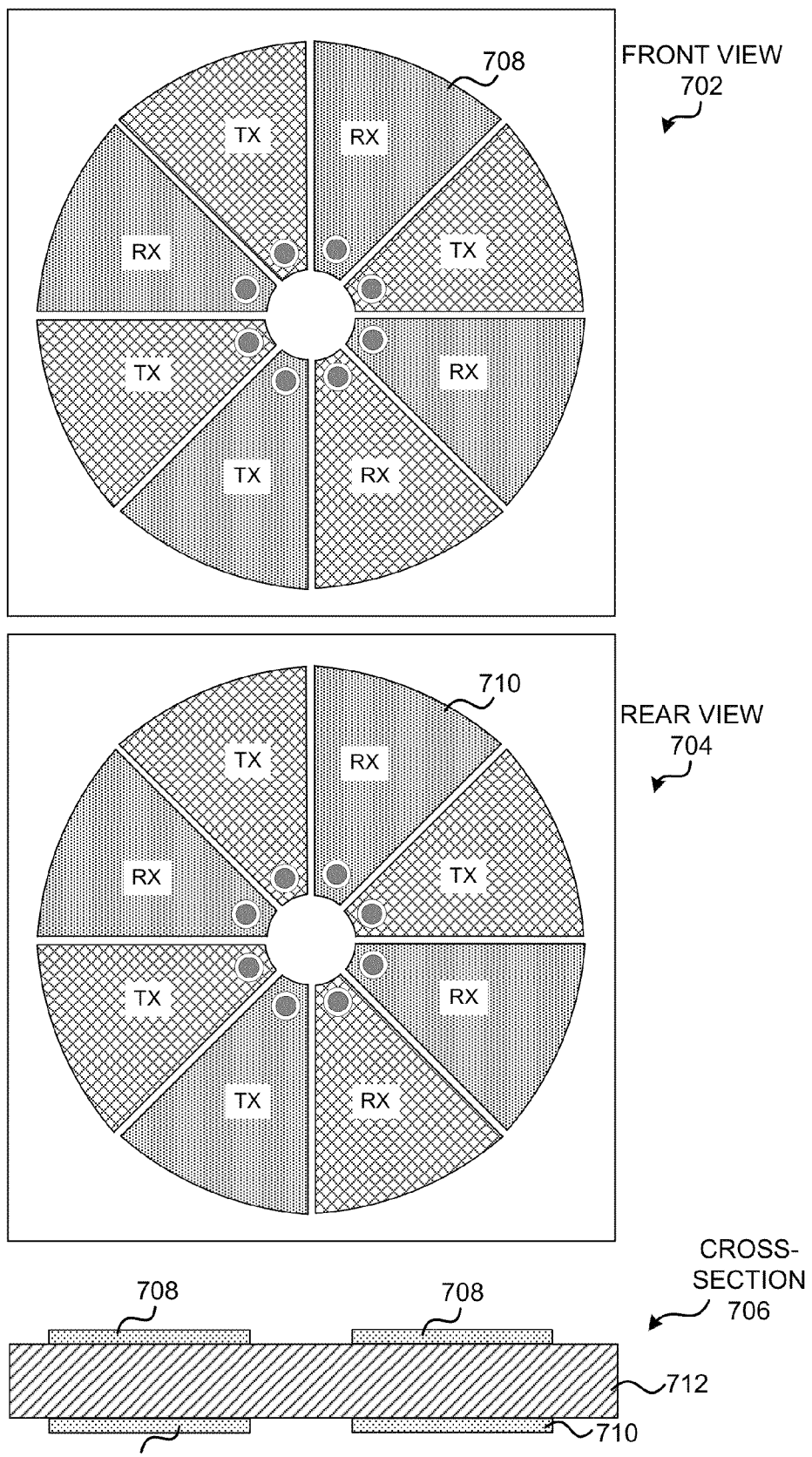
FIG. 7 shows three schematic diagrams of another example improved patch antenna which has a circular shape.

As with earlier example circular antennas, the asymmetry of the patches 708, 710 means that they radiate circularly polarized waves and there are many ways in which the antenna shown in FIG. 7 may be driven. In one example, pairs of patches (with each pair comprising one patch 708 from the ring on the front side and a corresponding patch 710 from the ring on the rear side, where the two patches are aligned spatially) may be fed differentially. The cross-section view 706 in FIG. 7 does not show any chips (e.g. RF transmit/receive chips) or feed lines; however it will be appreciated that any chips and feed lines may, for example, be provided as shown in any of the examples shown in FIG. 3.

The additional example improved patch antennas shown in FIGS. 5-7 and described above are also compact and are not limited by a patch pitch (and hence spacing between patches) which is wavelength dependent. As described above with reference to antenna 200 shown in FIG. 2, additionally, both transmit and receive patches can be provided within the same area. The small size of these improved patch antennas may make them suited to mobile applications where there is limited area for antennas. These improved patch antennas shown in FIGS. 5-7 may also be used to provide increased gain, bandwidth and/or bands of operation. Like the antenna 200 shown in FIG. 2, the antennas shown in FIGS. 5-7 may also be fabricated using standard processes.

Figure 8:
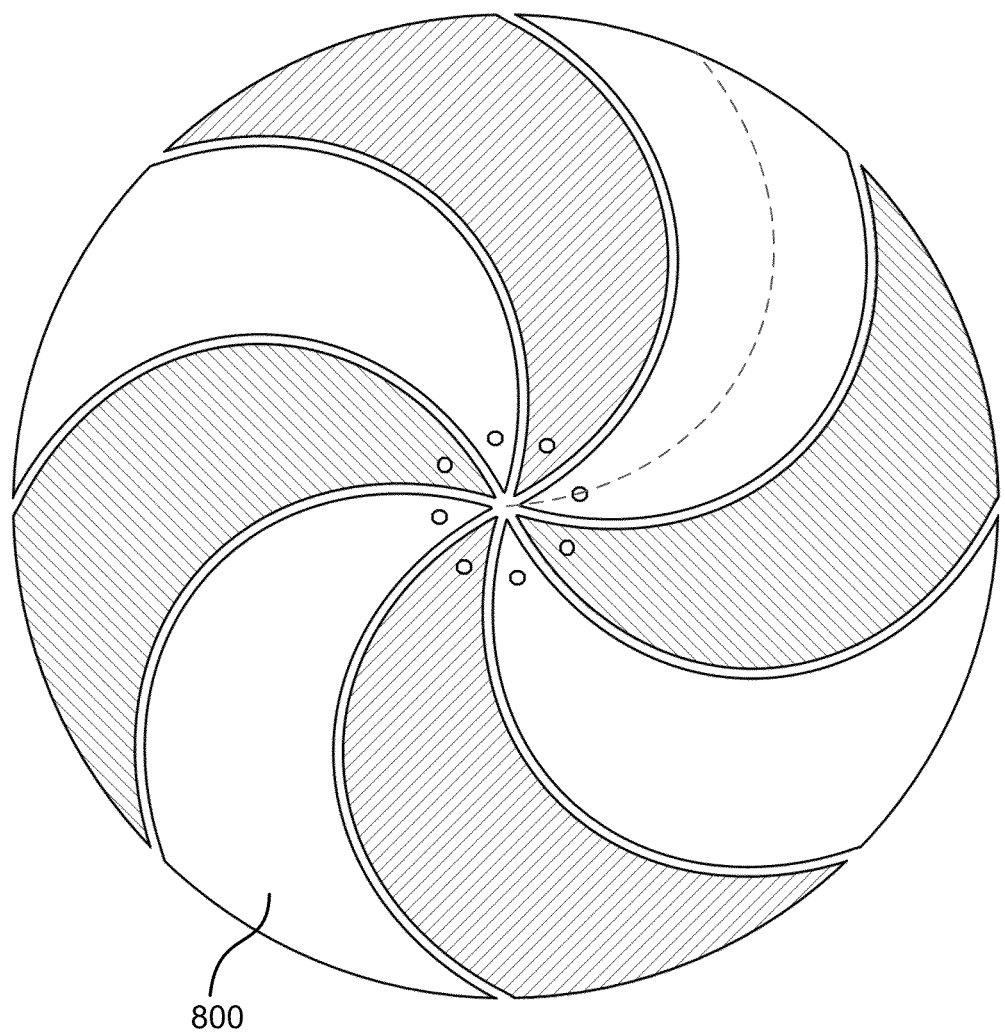
FIG. 8 shows a schematic diagram of another example improved patch antenna which has a circular shape.

It will be appreciated that although the examples described above show patches which all have four sides (two straight sides and two arcuate sides), the shape of the patches may be varied whilst still maintaining the property that they radiate circularly polarized waves. In an embodiment, shown in FIG. 8, the patches 800 may have 3 arcuate sides e.g. an antenna patch may be formed of a logarithmic taper and may be asymmetric about the radial axis of the patch. A logarithmic taper structure provides a higher patch density, therefore the total gain may be large and the beam steering may be more precise. The logarithmic tapers may increase the bandwidth and provide better matching.

Figure 9:
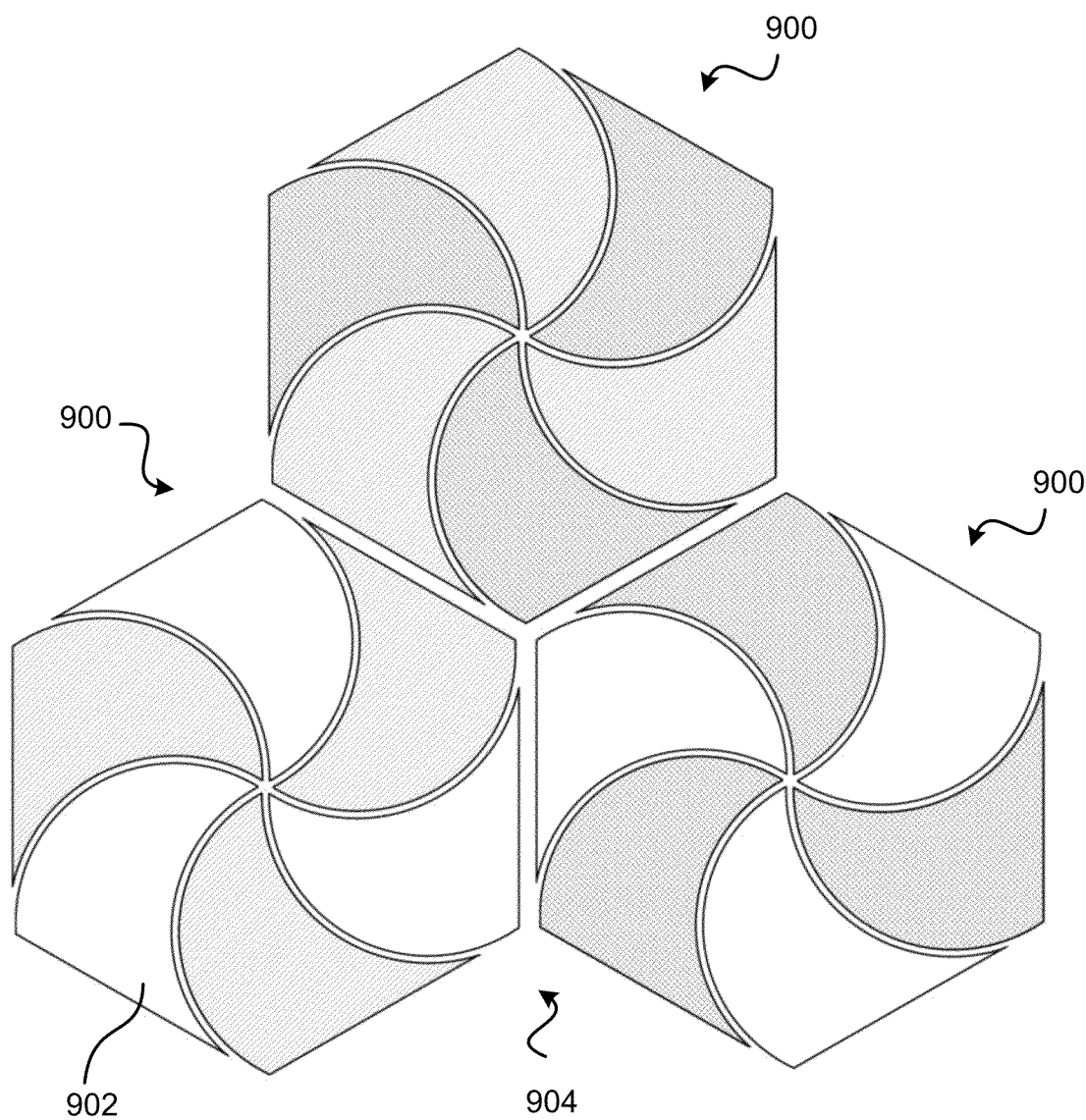
FIG. 9 shows a schematic diagram of an example improved patch antenna array.

In another embodiment, antenna patches 902 may have two arcuate sides and one straight side to form an antenna 900 which is hexagonal or another, polygonal shape. In an alternative example the patches may be triangular in form. A polygonal shape may facilitate tessellation of the antennas to form an array 904, as shown in FIG. 9. By using an array of antennas a very sharp and high gain beam may be formed which can be used in high security long distance communication systems or space communication systems. They may also be used in short range communication systems to replace the hard wiring between devices such as desktop components. Although the array of FIG. 9 is formed using polygonal antennas, other shapes e.g. circular antennas may be used to form an array.

In an example application, the circular antennas described above may be used for 60 GHz Wireless Gigabit (WiGig) devices.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

What is claimed is:

1. A radially segmented antenna comprising a first plurality of patches arranged in a ring around a central point and wherein each patch forms a segment of the ring and is spaced from two adjacent patches in the ring, wherein, in use, alternate patches are arranged to transmit signals and non-transmitting patches are terminated into an open circuit.

2. A radially segmented antenna according to claim 1, further comprising a central circular area centered on the central point and wherein each patch does not extend into the central circular area.

3. A radially segmented antenna according to claim 2, wherein each patch comprises two straight sides and two arcuate sides and wherein the arcuate sides are arranged between the two straight sides.

4. A radially segmented antenna according to claim 2, further comprising a chip mounted within the central circular area and a plurality of feed lines connecting the chip to at least a subset of the patches.

5. A radially segmented antenna according to claim 1, wherein each patch is symmetrical about a line extending radially from the central point which bisects the patch.

6. A radially segmented antenna according to claim 1, wherein each patch tapers towards the central point.

7. A radially segmented antenna according to claim 1, further comprising a feed point for each patch, the feed point for a patch being positioned within the patch towards the central point.

8. A radially segmented antenna according to claim 7, wherein the feed point for a patch is positioned on a line extending radially from the central point which bisects the patch.

9. A radially segmented antenna comprising a first plurality of patches arranged in a ring around a central point and wherein each patch forms a segment of the ring and is spaced from two adjacent patches in the ring, and according to claim 1, further comprising a second plurality of patches arranged in a second, concentric, ring around the central point and wherein each patch in the second plurality of patches forms a segment of the second ring and is spaced from two adjacent patches in the second ring.

10. A radially segmented antenna according to claim 9, wherein each of the patches in the first plurality of patches is of a first area and each of the patches in the second plurality of patches is of a second area, and wherein the first and second areas are different sizes.

11. A radially segmented antenna according to claim 9, wherein the first and second pluralities of patches comprise different numbers of patches.

12. A radially segmented antenna according to claim 1, wherein the antenna is circular in form.

13. A radially segmented antenna according to claim 1, wherein the antenna is hexagonal in form.

* * * * *

UNITED STATES PATENT AND TRADEMARK OFFICE
CERTIFICATE OF CORRECTION

PATENT NO. : 8,970,435 B2  
APPLICATION NO. : 13/646620  
DATED : March 3, 2015  
INVENTOR(S) : Aboush Page 1 of 1

It is certified that error appears in the above-identified patent and that said Letters Patent is hereby corrected as shown below:

In the specification

In Column 2, Line 56, delete "2-3 min" and insert -- 2-3 mm --, therefor.

In Column 6, Line 44, delete "patches" and insert -- patches in the outer --, therefor.

In Column 8, Line 28, delete "another," and insert -- another --, therefor.

Signed and Sealed this
Third Day of November, 2015

Michelle K. Lee
*Director of the United States Patent and Trademark Office*